United States Patent [19]
Bahnck et al.

[11] 3,946,931
[45] Mar. 30, 1976

[54] METHODS OF AND APPARATUS FOR BONDING AN ARTICLE TO A SUBSTRATE

[75] Inventors: Norman Bahnck, Bethlehem; Raymond H. Booth, Allentown; John A. Boyer, Allentown; Jack J. Monahan, Allentown, all of Pa.

[73] Assignee: Western Electric Company, Inc., New York, N.Y.

[22] Filed: Nov. 27, 1974

[21] Appl. No.: 527,924

[52] U.S. Cl. ............ 228/102; 228/105; 228/180 A; 228/6 A; 228/49; 29/626
[51] Int. Cl.² ...................... H05K 3/30; H01L 21/58
[58] Field of Search ............... 228/3.1, 3-6, 8-10, 228/44, 47, 49, 102, 105, 180; 29/471.1, 471.3, 626

[56] References Cited
UNITED STATES PATENTS

| | | | |
|---|---|---|---|
| 3,361,891 | 1/1968 | Whitefield | 228/44 X |
| 3,379,357 | 4/1968 | Chagon et al. | 228/47 |
| 3,475,805 | 11/1969 | Rottmann | 29/203 B |
| 3,581,375 | 6/1971 | Rottmann | 29/203 B |
| 3,696,985 | 10/1972 | Herring et al. | 228/4 |
| 3,776,394 | 12/1973 | Miller | 214/1 R |
| 3,785,507 | 1/1974 | Wiesler et al. | 214/1 BH |
| 3,793,710 | 2/1974 | Monahan et al. | 228/6 X |
| 3,838,274 | 9/1974 | Doubek, Jr. et al. | 250/201 |
| 3,861,019 | 1/1975 | Choate et al. | 29/208 E |

Primary Examiner—Al Lawrence Smith
Assistant Examiner—K. J. Ramsey
Attorney, Agent, or Firm—W. O. Schellin

[57] ABSTRACT

A bonder for attaching in succession small articles such as electronic devices to substrates has eight stations located along the path of a rotary member. The rotary member supports eight holders for substrates which are moved in sequence from station to station. At a first station a substrate is loaded onto one of the holders. The holder is then moved to an alignment station and transferred from the support member to a planar manipulator. An optical alignment control system recognizes a position of the substrate on the holder and controls the manipulation of the holder to align a substrate to a predetermined reference axis. The holder is then transferred back to the support member to fix the position of the substrate with respect to the support member. At the next station an article is also aligned to a corresponding reference axis and then tack-bonded or preliminarily attached to a bond site on the substrate. The article is then permanently bonded and the substrate with the bonded article is unloaded at an unload station. Prior to the completion of the cycle, the substrate holder is recentered to a starting position to prevent cumulative movement of the substrate holder with respect to the support member.

18 Claims, 20 Drawing Figures

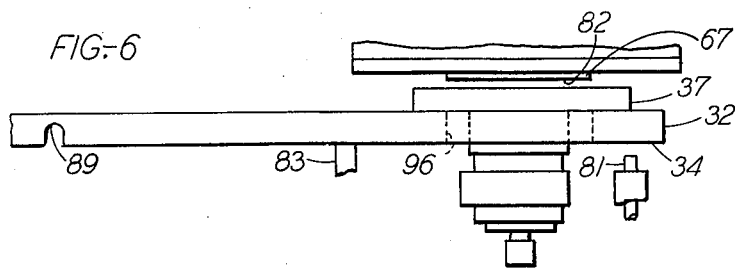
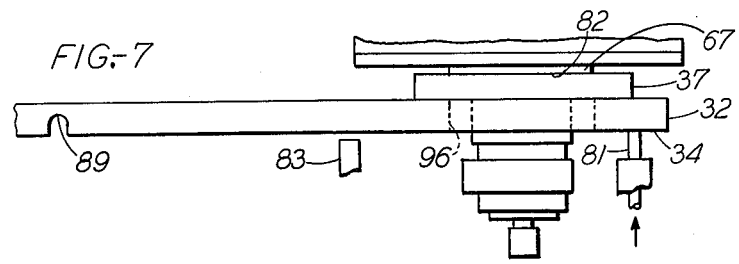
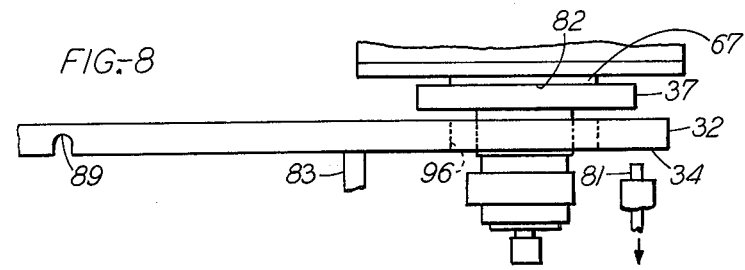
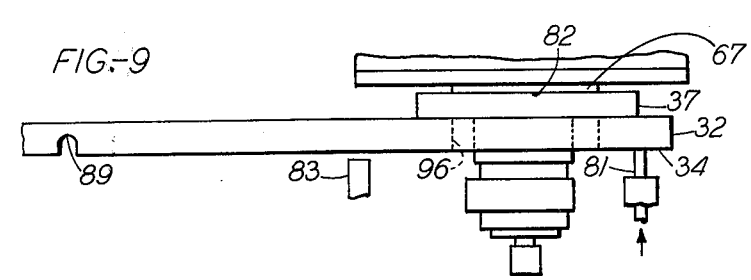
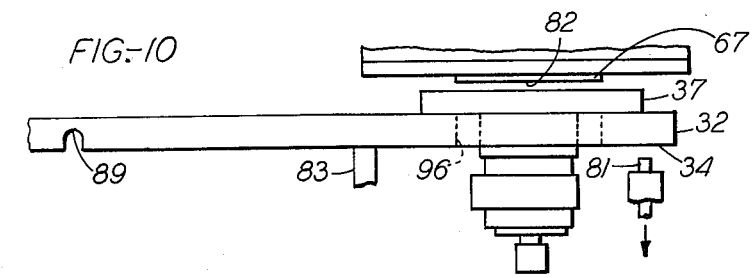

METHODS OF AND APPARATUS FOR BONDING AN ARTICLE TO A SUBSTRATE

BACKGROUND OF THE INVENTION

1. Field of the Invention

The invention relates to methods of and apparatus for bonding an article to a substrate. More particularly, the invention relates to methods of and apparatus for sequentially bonding small articles, such as semiconductor chips or other electronic device, to a substrate. Because of the small size of such devices, the invention relates to precision handling, and bonding of the devices and substrates.

2. Description of the Prior Art

In bonding an article such as an electronic device to a substrate, a generally known approach is to align the electronic device to a bonding axis and to temporarily hold it with a bonding tip along the bonding axis. Thereafter, a substrate is transferred to the bonding axis and a bond site on the substrate is aligned with respect to the bonding axis and to the previously aligned device to bring the device into contact with the substrate and to bond it thereto. Such basic methods and the respective apparatus are, for instance, disclosed in U.S. Pat. No. 3,477,630 to F. J. Schneider. The referred-to art provides for a magazine-type feed for the substrates and a movable holder for the semiconductor devices which permit the devices as well as the substrates to be brought into alignment with the bonding axis without difficulty.

However, such a precision alignment of the substrate as well as the device is always time consuming. It is consequently desirable to reduce and minimize the time intervals required to load and align the substrate to the semiconductor device to optimize the output of a particular bonding machine. In U.S. Pat. No. 3,793,710 to Monahan et al. a solution other than feeding substrates from a magazine was provided that nevertheless optimized the time required to align the substrate with the chip.

In bonding small articles such as semiconductor devices to substrates, the bonding operation itself requires a relatively fixed time interval. In raising the hourly output of a bonder, it is therefore desirable to minimize time requirements which pertain to steps other than bonding of the device to the substrate. These are steps such as feeding a substrate and a device and aligning the substrate to the device, as well as unloading the bonded product from the bonder.

SUMMARY OF THE INVENTION

It is, therefore, an object of the present invention to provide new and improved methods of handling electronic devices and substrates in conjunction with bonding the devices to substrates.

It is another object of the invention to substantially eliminate manual handling of the substrates and devices.

It is a further object of the invention to establish a handling and bonding sequence of which each step is executed substantially simultaneously with other steps on a plurality of devices and substrates to bond in sequence the devices to the corresponding substrates.

With these and other objects in mind, the present invention encompasses new and improved methods of and apparatus for bonding an electronic device to a preselected area of a substrate.

A particular method of the invention includes moving a substrate holder mounted on the support member in sequence to a substrate alignment station and then to a bonding station, transferring the substrate holder at the alignment station from the support member to a manipulator, manipulating the position of the substrate holder to align a substrate located thereon with respect to a reference axis, and transferring the substrate holder from the manipulator to the support member to retain the position of the substrate aligned to the reference axis with respect to the support member, whereby a bond site on the substrate is precisely aligned with the article to be bonded thereto when the substrate holder is moved to the bonding station.

A particular apparatus for bonding an article to a substrate, according to an aspect of the invention includes a substrate holder and a support member for moving the substrate holder in sequence to an alignment station and then to a bonding station. A mechanism at the alignment station functions to transfer the substrate holder from the support member to a manipulator. The manipulator aligns a substrate located on the substrate holder with respect to a reference axis. The mechanism then transfers the substrate holder from the manipulator to the support member.

A particular apparatus for bonding an article to a substrate, in accordance with another aspect of the invention, includes a base, a support member movably mounted to advance along a predetermined path with respect to the base, a substrate alignment station, and a bonding station each located along a path of the support member, a substrate holder releasably mounted to the support member, and a provision located at the alignment station for adjusting the position of the substrate holder with respect to the path to position the bond site on a substrate into alignment with the bonding axis upon the substrate holder having advanced into the bonding station.

In another aspect of the invention the apparatus includes a provision for aligning and for bonding the article to the bond site of the substrate at the bonding station.

In a further aspect of the invention, the bonding process is divided into preliminary bonding and final bonding of the device to the substrate.

BRIEF DESCRIPTION OF THE DRAWING

Other objects and advantages of the present invention will become apparent from the detailed description when considered in conjunction with the accompanying drawing wherein:

FIGS. 6–10 show various steps of transferring a substrate holder of the apparatus in FIG. 2 between a support lever and the manipulator of FIG. 5;

DETAILED DESCRIPTION

The Product

Figure 1:
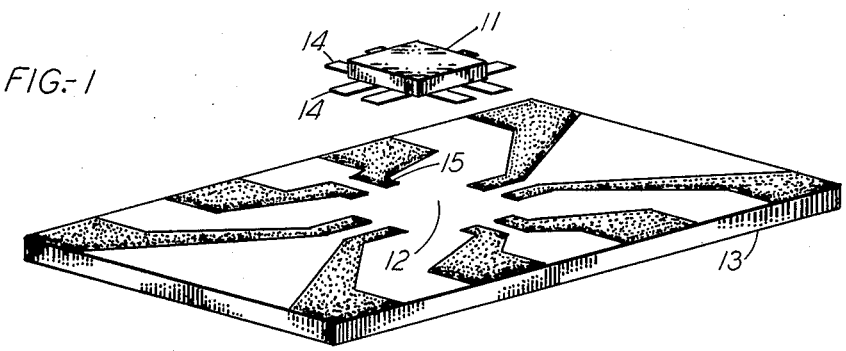
FIG. 1 is an exploded view of the product of a preferred embodiment of this invention.

The present invention is described in relation to an apparatus for bonding a beam-lead device 11 to a bond site 12 on a metallized substrate 13. Referring to FIG. 1, there is shown such device 11 aligned with and located above the bond site 12. When the device 11 is brought into contact with the substrate 13, beam leads 14 on the device 11 move into contacting alignment with metallized circuit leads 15 on the substrate.

It is not intended to restrict the invention to bonding of beam-lead devices to substrates since it will readily be seen that many of the handling and alignment steps are readily adaptable with only slight modifications to bonding of articles other than the beam-lead device 11 to substrate. In bonding electronic devices to substrates the invention is readily adaptable to handling and bonding beamless devices also referred to as flip chips.

THE APPARATUS IN GENERAL

Figure 2:
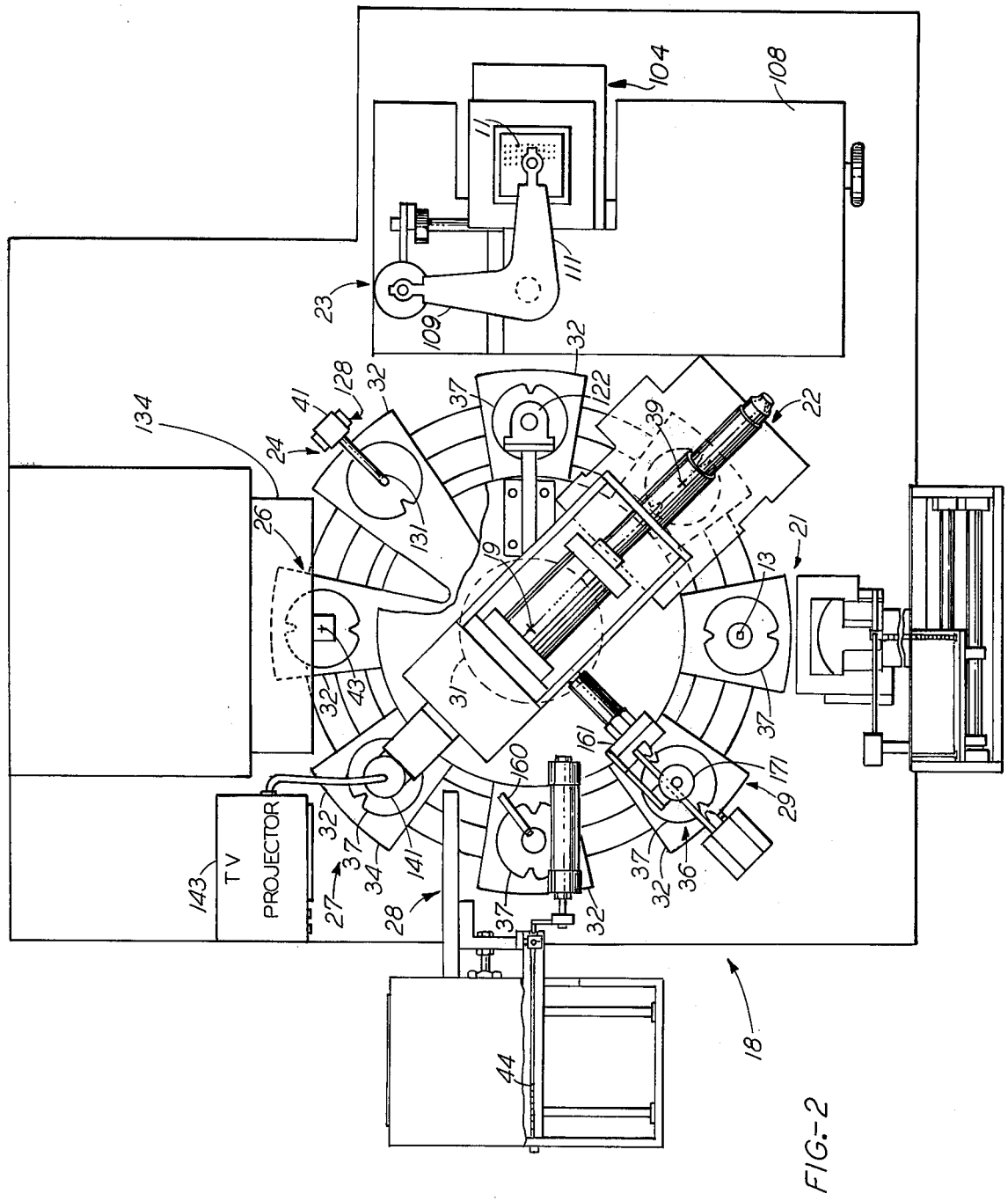
FIG. 2 is an overall top view of an apparatus of a preferred embodiment of this invention.

Referring now to FIG. 2, there is shown an apparatus which is designated generally by the numeral 18, for bonding an article such as the beam-lead device 11 to a substrate 13. The apparatus 18 is a rotary-type machine, and, more particularly, an indexing machine having eight stations located on a circular path about a central axis 19.

The eight stations of the apparatus 18 are arranged in the following sequence: a substrate load station 21; a substrate alignment station 22; a device tack-bonding station 23; a monitoring station 24; a final bond station 26; a product monitoring station 27; an unload station 28; and a recenter station 29.

A central rotating member 31 has eight leaf-type leavers 32 radially extending from the center axis 19. The levers 32 are equally spaced about the center axis 19 to correspond to the spacing of the eight stations about the axis 19. Thus, each of these levers 32 moves into simultaneous alignment with one of the stations spaced about the axis 19.

The levers 32 are of identical shape. Each lever 32 has near its outer end 34 an area 36 adapted to accept a substrate holder which is designated generally by the numeral 37. As the member 31 is indexably moved during the operation of the apparatus 18, each one of the substrate holders 37 is moved in sequence to each of the eight stations of the apparatus 18.

While the apparatus 18 is operating, substrates 13 are aligned in sequence to a reference axis 39 and then a device 11 is bonded to the bond site 12 of the aligned substrate 13. To accomplish sequential bonding of devices 11 to substrates 13, one of the substrates 13 is loaded onto the substrate holder 37 at the load station 21.

As the rotating member 31 moves all the substrate holders 37 to a new position, the loaded substrate 13 is indexed to the alignment station 22. At the alignment station 22 the substrate holder 37 is completely separated from the lever 32 to permit accurate lateral adjustments to the substrate holder. Such a lateral adjustment or manipulation of the substrate holder 37 moves the bond site 12 on the substrate 13 in relation to the reference axis 39.

Further movement of the member 31 brings the substrate 13 to the tack-bond station 23 where a beam-lead device 11 is attached to the bond site 12 of the substrate 13 by a preliminary bond. The substrate holder 37 is then advanced to the initial monitoring station 24 where the presence of the tack bonded device is ascertained. Should such a device 11 not have become attached to the substrate 13 at the previous station 23, an indicator signal is generated by a monitoring unit 41. Such a signal inhibits a final bond step after the next movement of the rotating member 31.

After the monitoring unit 41 indicates the presence of one of the devices 11 on the substrate 13 at the monitoring station 24, the next movement of the rotating member 31 positions the device 11 on the substrate 13 into alignment with a bonding axis 43 at the final bond station 26 where the device 11 becomes permanently bonded to the substrate 13.

The rotating member 31 then moves the substrate holder 37 to the final monitoring station where the quality of the bond of ensuing product 44, namely, the bonded device 11 on the substrate 13, is checked. A determination can be made at this point whether the product 44 is acceptable or whether it should be discarded. Accepting the product 44 requires no action, since in the course of normal operation of the apparatus 18, the product 44 is unloaded at the next station. However, should the product be defective, a signal generated at this point activates an alternative mode of operation at the unload station 28 after the substrate holder 37 has been indexed from the final monitoring station 27 to the unload station 28.

At the unload station 28, an acceptable product is removed from the substrate holder 37 and loaded into a magazine 46. In case a determination has been made at the final monitoring station 27 that the product 44 is not acceptable, the product is then unloaded and discarded. After the product 44 has been unloaded from the substrate holder 37 at the unload station 28, the substrate holder 37 is moved to the recenter station 29 where it is returned to a neutral or start position with respect to the seat 36 on the lever 32 on the rotating member 31. Returning the substrate holder 37 to the start position is important since repeated movement of the substrate holder 37 during the alignment of the substrates 13 at the alignment station 22 can result in a continual migration of the substrate holder 37 with respect to the lever 32. This migration, because of the limited amount of adjustment play provided in the lever 32, would ultimately result in the inability of the apparatus 18 to align further loaded substrates 13.

THE SUBSTRATE LOAD STATION

Figure 3:
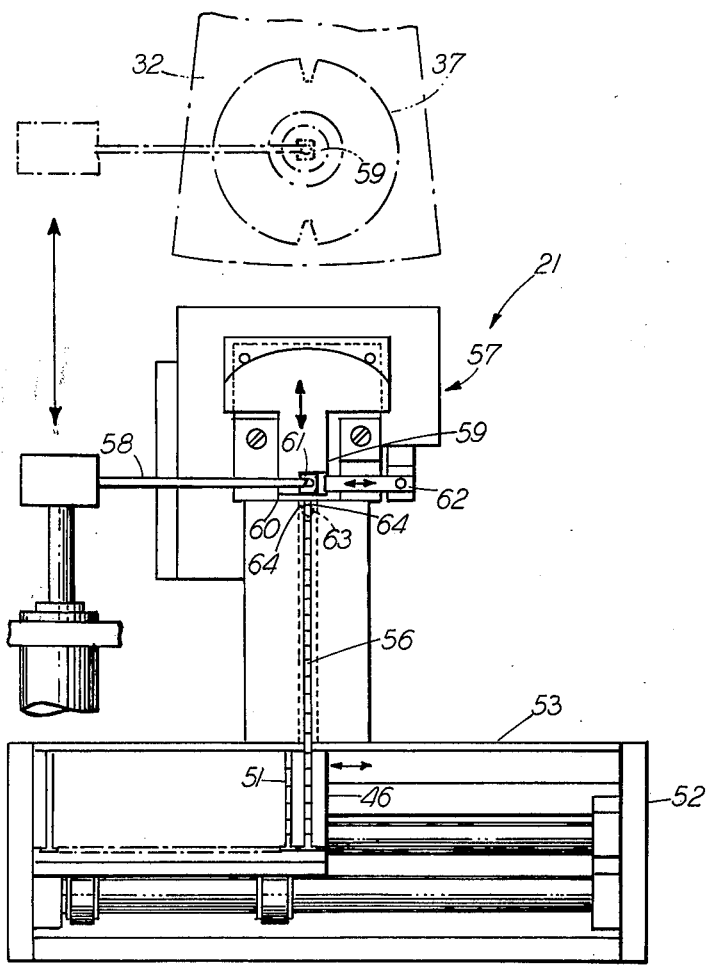
FIG. 3 is a top view of a loading station of the apparatus shown in FIG. 2.

Referring now to FIG. 3, substrates 13 are sequentially transferred from a magazine, such as the magazine 46, onto substrate holders 37 as the substrate holders 37 are indexed to the load station 21. While other types of substrate magazines can be used within the scope of the present invention, the apparatus 18 is described in conjunction with a flat, rectangular 46 that uses a plurality of parallel longitudinal grooves or tracks 51, each track 51 holding a predetermined number of substrates 13.

At the substrate load station 21, a magazine holding rack 52 supports one of the magazines 46 in a position which locates the tracks 51 of the magazine 46 in a substantially vertical orientation. When the tracks 51 are in such a vertical position, substrates 13 in the magazine 46 are urged toward the lower end of each of the tracks 51. In the holding rack 52, however, all but one of the tracks 51 are blocked by a frame portion 53 thus preventing the substrates 13 from sliding out of the tracks 51. The one unblocked track 51 is connected to a feed track 56. The substrates 13 advance, urged by gravity, along the track 56 into a horizontal load position adjacent an escapement 57. The escapement separates one of the substrates 13 from the remaining substrates being fed from the magazine 46 to permit it to be picked up by a vacuum transport arm 58. The transport arm 58 then transfers the substrate 13 onto a vacuum plate 59 of the substrate holder 37.

The escapement 57, shown in FIG. 3, prepares one of the substrates 13 for pickup by the vacuum transport arm 58. Under gravitational influence the substrates 13 move along the track 56 until the first one slides onto an escapement platform 60 and contacts the end plate 61 of the platform 60. At that time, the escapement platform 60 is located contiguous to the end of the track 56. A locating guide 62 energized by an air cylinder (not shown) moves the first substrate 13 to one side of the platform 60.

Prior to pickup of the first substrate 13 from the platform 60, a linear actuator 63 under the second substrate 13 adjacent the first substrate is extended. The actuator 63 clamps the second substrate 13 against top guides 64 of the feed track 56. The platform 60 of the escapement is then moved away from the track 56 to separate the first substrate 13 located on the platform 60 from the second substrate 13 which is being held by the actuator 63. Of course, clamping the second substrate 13 by the actuator prevents movement of all the other substrates 13 located on the track 56 and in the track 51 of the magazine 46 in alignment with the track 56.

Upon movement of the platform 60 away from the track 56, the locating guide 62 moves away from the first substrate 13 so that the vacuum arm 58 can attach to and pickup the substrate 13, as shown in FIG. 3. Thereafter the platform 60 returns to its starting position contiguous to the track 56. Retracting the linear activator 63 releases the substrates 13 held in the track 56. Gravity acting on the substrates 13 in the track 56 move the next substrate 13 onto the platform 60 and the operating cycle of the escapement is repeated. The escapement prevents two adjacent substrates 13 from clinging together by interlocking their edges when one of the substrates 13 is lifted by the vacuum arm 58 to be transferred to the substrate holder 37.

The vacuum transport arm 58 is a commercially available item that is commonly used for handling small workpieces such as the substrates 13. The transport arm 58 has vertical reciprocating movement in addition to a horizontal reciprocating stroke between the escapement 57 and the vacuum plate 59 of the substrate holder 37. A vacuum provision in the arm 58 is selectively turned on to hold the workpiece such as the substrate 13 at the end of the arm. In conjunction with the presently described apparatus 18, the vacuum transport arm 58 is cyclically operated to place one of the substrates 13 onto the vacuum plate 59 of the substrate holder 37 after each movement of the rotating member 31 so that one of the substrates 13 is loaded onto each substrate holder 37 as it moves into position at the load station 21, shown in FIG. 3.

Successive substrates 13 are placed on vacuum plates 59 of successively positioned substrate holders 37 with repetitive tolerances of usually no more than five thousandths from a desired portion. Small variations in orientation and location occur because of vibrations in the loading mechanism and variations in positioning the substrates 13 at the escapement 57 with respect to the transport arm 58. These slight inaccuracies in locating the substrates 13 are corrected for at the alignment station 22 where the locations of consecutively loaded substrates are adjusted with respect to the rotational path of the member 31.

THE ALIGNMENT STATION

Once one of the substrates 13 is loaded onto the vacuum plate 59 of the respective substrate holder 37, the substrate is held there by vacuum connected to the substrate holder 37. As the rotating member 31 undergoes its next movement, the lever 32 indexes the substrate holder 37 with the substrate 13 thereon to the alignment station 22.

Figure 4:
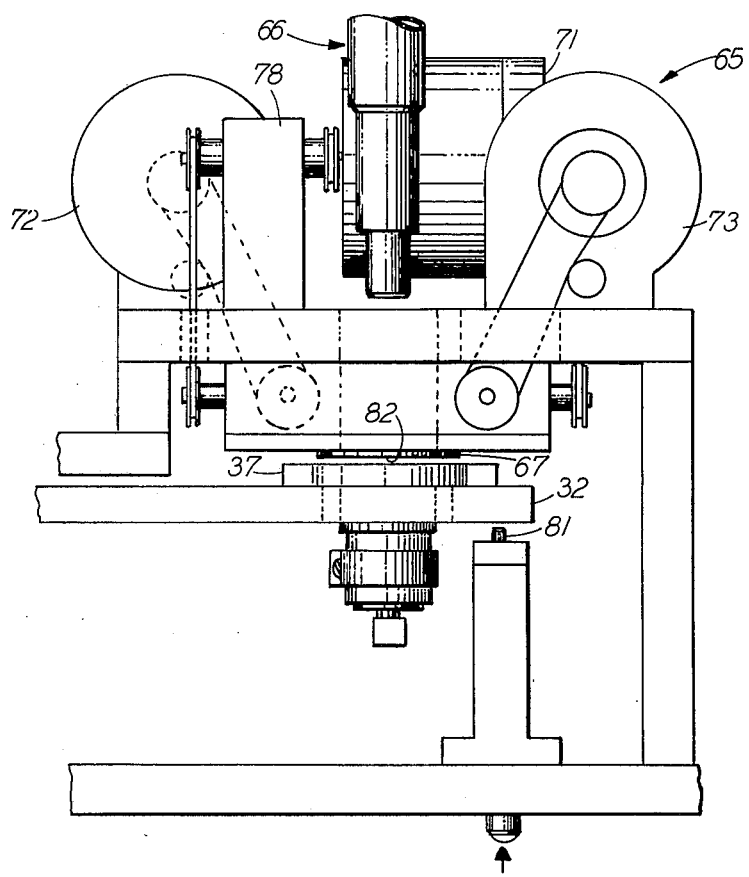
FIG. 4 is a side elevation of an alignment station of the apparatus in FIG. 2.

Referring to FIG. 4, the alignment station 22 includes three basic apparatus elements, (1) a planar manipulator designated generally by the numeral 65 which adjusts the position of the substrate holder 37 with the substrate thereon to the reference axis 39, (2) an optical reference system 66 which controls the action of the manipulator 65 to position the substrate holder 37 with respect to the reference axis 39, and (3) a mechanism for accurately transferring the substrate holder 37 between the lever 32 and the manipulator 65.

In general, the planar manipulator 65 functions in a manner similar to other known manipulators of the type used to orient microcircuits or similar workpieces which have to be precisely positioned. In some respect, however, the described manipulator 65 differs from commercially available manipulators. For instance, the manipulator 65 is capable of exerting a holding force on the top surface of a flat object such as the substrate holder 37 and then of controlling the lateral movement of such an object. Furthermore, the manipulator 65 not only maintains a hold on the top surface of the substrate holder 37, but it also permits access to the central portion of the holder 37 where the substrate 13 is located. Consequently, the position of the substrate 13 can be continually monitored by the reference system 66 while the manipulator 65 is orienting the substrate holder 37 until the substrate 13 is precisely referenced with respect to the axis 39.

The manipulator 65 has a single adjustable base table 67 which is subjected to controlled planar motion. Referring to both FIGS. 4 and 5, the operation of the manipulator 65 is more readily explained. The base table 67 moves jointly with a collar 68 in the X and Y directions but is rotatably mounted in the collar 68 to be rotated independently of the collar 68. Two pairs of lead screws 69 and 70 extend in a single plane parallel to the plane in which the base table 67 moves. The lead screws are pairwise parallel to each other and each pair 69 or 70 is perpendicular to the other. The lead screws 69, for example, act on the collar 68 to drive the collar and the base table 67 along one of the major axes of the plane of movement of the table. The other pair of lead screws 70 acts diretly on the base table 67 to drive the table 67 and the collar 68 along the other major axis of movement perpendicular to the first major axis when each of the lead screws of thee pair 70 move the table 67 in the same direction. However, each of the pair of screws 70 is driven independently of the other. Therefore, the screws can be driven opposite one another to drive the base table 67 in the θ direction independently of any movement of the table 67 and the collar 68 in either the X or the Y directions.

The center of the base table 67 is open to afford an unobstructed view of the center of the substrate holder 37 when the substrate holder is located at the base table 67. The opening provides access for the optical reference system 66 to compare the position of the substrate 13 on the substrate holder 37 with respect to the reference axis 39. The comparison is used to align the substrate 13 to a predetermined position with respect to the reference 39. The described apparatus 18 uses an automatic position recognition system to recognize the position of the substrate 13 with respect to the reference axis 39 and to generate control signals to drive the manipulator 65.

Such an automatic system is described in a copending application Ser. No. 475,006 filed May 31, 1974 in the name of Montone et al. which is assigned to the assignee of this application. According to the referred-to application, a workpiece is precisely aligned with another by comparing essentially real time images of the workpieces to a real time generated reference pattern, and by then generating a control signal to drive a manipulator such as the manipulator 65 to align the workpieces.

Another optical system, which is commercially available from Precision Instruments Company, Inc., a subsidiary of Kulicke & Soffa, is described in conjunction with the preferred embodiment of this invention. The last mentioned system involves storing a video image of a workpiece, such as the substrate 13 when the substrate 13 is located at a desired location, such as the reference axis 39. A spiral video scan of subsequent substrates 13 is then compared with the stored image of the properly located substrate 13. An error signal is then generated which is applied to drive motors of the corresponding manipulator 65 in the X, Y or θ direction.

The described manipulator 65 utilizes one motor 71 to drive the base table in the X direction and two cooperating motors 72 and 73 to drive the base table 67 in either the Y direction or in θ rotation. The error signal from the optical system 66 interfaces with an electrical translator (not shown) which converts the θ quantity by conventional type operational amplifiers into two linear Y-direction signals. One of the signals is added to the signal directed to one of the motors and the same quantity is subtracted from the error signal fed to the other of the two motors 72 and 73 to superimpose a θ correction motion onto the Y correction motion being fed to the motors 72 and 73.

Figure 5:
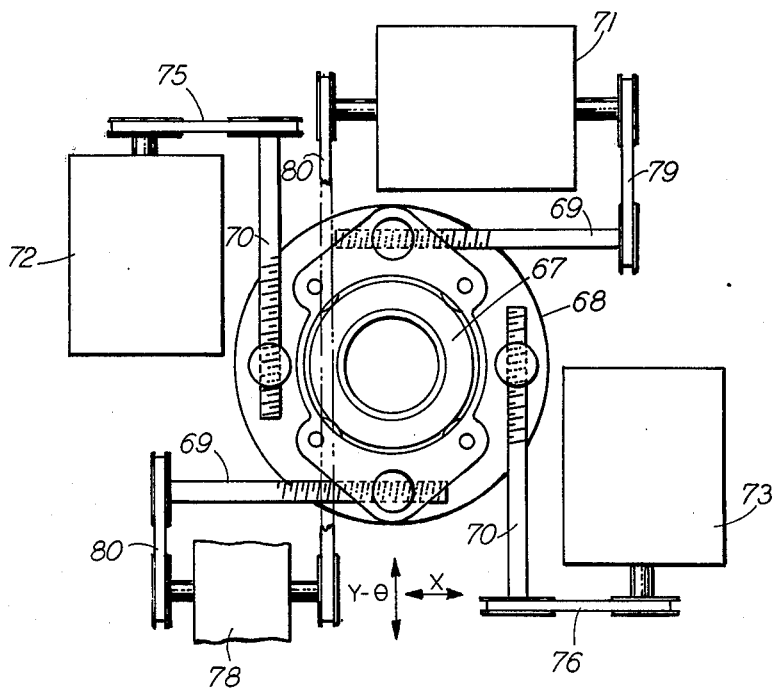
FIG. 5 is a simplified representation of a manipulator shown in FIG. 4.

Referring to FIG. 5, each of the lead screws 70 are driven by the motors 72 and 73 through separate drives 75 and 76, respectively. The motor 71, on the other hand, drives both lead screws 69 simultaneously. One lead screw 69 is driven by a drive 77 from the motor 71 directly; the other lead screw 69 is driven by the motor 71 through an idler block assembly 78 and through connecting drives 79 and 80.

The alignment of the substrate 13 to the reference axis 39 is to be precise and any error in the alignment is expected to be at a minimum. The apparatus 18 utilizes a method of completely divorcing the substrate holder 37 from the respective lever 32 to align the respective substrate 13 to the reference axis 39. Accordingly, at the alignment station 22, the substrate holder 37 is transferred from the lever 32 to the manipulator 65. Once transferred to the manipulator 65, the position of the substrate holder 37 is accurately adjusted until the bondsite 12 of the substrate 13 is in alignment with the reference axis 39 within the precision limits of the apparatus. Thereafter, the substrate holder 37 is transferred back to the lever 32 in a direction perpendicular to the plane of alignment to lock in the position of the precisely located substrate holder 37 with respect to the lever 32 of the rotating member 31. The position of the reference axis 39 coincides with that part of the lever 32 which passes directly through the bonding axis 43. Consequently, the bondsite adjusted to the reference axis 39 moves into alignment with the bonding axis 43 as the rotating member 31 moves the respective substrate holder 37 to the bonding station.

Small alignment errors frequently occur when an object such as the substrate 13 is moved in a plane while the substrate is still being held in frictional contact with a supporting member. Any contact is likely to produce frictional forces which can result in strain and elastic deformation of the supporting member, such as, for instance, the rotating member 31. Such a deformation during the lateral alignment is likely to result in some movement of the lever 32 once the alignment force is removed, to cause the aligned substrate to shift laterally with respect to the axis 39. A similar shift is not discernible when an adjustment of the substrate 13 is made independently of the supporting lever 32.

FIGS. 6 through 10 illustrate the transfer operation of the substrate holder 37 between the lever 32 and the base table 67. As the substrate holder 37 moves, supported by the lever 32, into position at the alignment station 22 a push rod 81 contacts the end 34 of the lever 32 from beneath and raises the lever 32 with the substrate holder 37 toward the underside 82 of the base table 67. The push rod 81 thus lifts the lever 32 from a vertically adjustable support 83 against which the lever 32 normally rests.

Upon the substrate holder 37 having moved into contact with the base table 67, a vacuum between the base table 67 and the substrate holder 37 is activated and a vacuum normally holding the substrate holder 37 in position on the lever 32 is turned off. The substrate holder 37 is thereby transferred from the lever 32 to the base table 67. Once the substrate holder 37 is held by the base table 67 and the push rod 81 is withdrawn (as shown in FIG. 8), the optical reference system 66 is activated and the position of the substrate 13 on the substrate holder 37 is aligned with respect to the reference axis 39.

After the substrate 13 has been aligned, the substrate holder 37 is transferred back to the lever 32. Referring to FIGS. 9 and 10, the push rod 81 moves the lever 32 toward the underside of the substrate holder 37. The vacuum is then switched to release the substrate holder 37 from the base table 67 and attach it to the lever 32. Thereafter, the push rod 81 retracts to return the lever 32 to its starting position as shown in FIG. 10.

Precise alignment of the substrate 13 with respect to the reference axis 39 is preserved by restricting the movement of the substrate holder 37 between the manipulator 65 and the lever 32 to a direction substantially perpendicular to the plane of adjustment. This is accomplished by minimizing the vertical movement of the lever 32 and by virtually eliminating any horizontal movement of the lever 32 with respect to the rotating member 31. The vertical movement of the lever 32 toward the manipulator 65 is minimized by separating the substrate holder 37 from the lever 32 without completely clearing the substrate holder from the lever 32. Thus, while the substrate holder 37 is being moved to align the substrate 13, the substrate holder still extends through the thickness of the lever 32. However, vertical as well as lateral clearance between the substrate holder 37 and the lever 32 permits any necessary adjustments.

Horizontal movement of the lever 32 with respect to the rotating member 31 is controlled by the rigid construction of the lever 32 as part of the rotating member 31 to eliminate horizontal movement with respect to the member 31 and to permit only such limited vertical flexing of the lever 32 as is necessary for transferring the substrate holder 36, for instance.

THE SUPPORT MEMBER AND SUBSTRATE HOLDER

Figure 11:
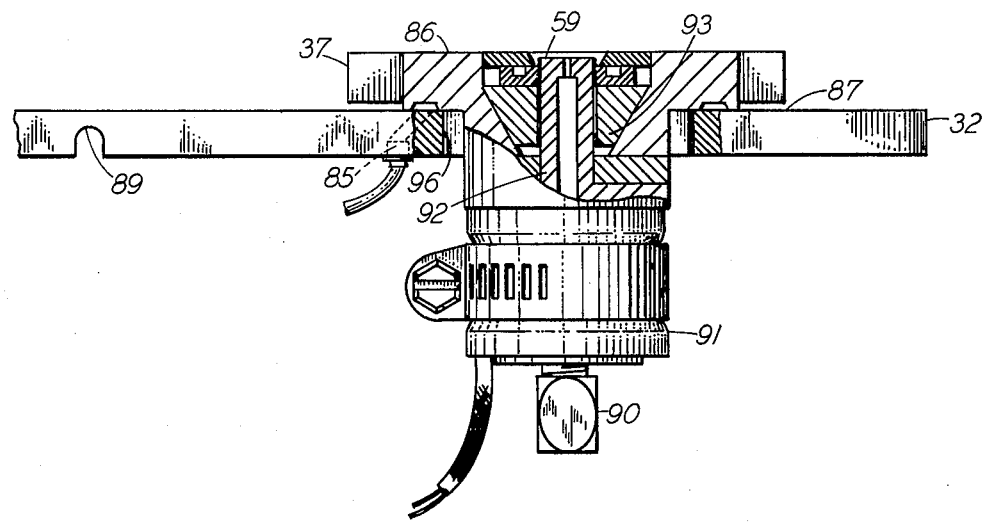
FIG. 11 is a more detailed view and partial section of the substrate holder in FIGS. 6–10 and the respective support arm or lever.

In FIG. 11 there is shown one of the substrate holders 37 mounted to one of the levers 32 of the rotating member 31. A vacuum is introduced through a vacuum port 85 in the lever 32 to hold the underside of the top plate 86 of the substrate holder 37 to the top surface 87 of the lever. Since the substrate holder 37 is rigidly mounted to the lever 32, the accuracy of positioning one of the devices 11 on the substrate holder 37 at each of the stations depends on the rigidity of the lever 32 in its plane of motion. To assure a position of the lever 32 which is parallel to the underside of the base table 67 when the top surface of the substrate holder moves into contact with the underside 82, the support 83 is normally adjusted to position the lever 32 at a slight incline from the horizontal. However, the angle of the incline is so small that the substrate holder 37 need only be raised approximately three thousandths of an inch to reach the horizontal.

To provide for vertical movement of the lever 32 without appreciable flexing of the lever itself, the lever 32 has a necked-down section 89 across its width. The section 89 is located near the central axis 19. Vertical flexing of the lever 32 takes place in the section 89 without appreciably effecting the rigidity of the rotating member 31 in its plane of rotation. The section 89 acts, consequently, as a hinge to facilitate vertical movement of the lever 32 with substantially no reduction in the capability of the member 31 to maintain the position of the substrate holder 37 in the plane of rotation of the member 31. Since the vertical movement of the lever 32 at its unsupported end is only a few thousandths of an inch, the flexing or strain in the section 89 takes place within the elastic limits of the member 31.

One of the functions of the substrate holder 37 is to support the substrate 13 to retain its desired position relative to the rotating member 31. A vacuum connection 90 through the center of the substrate holder 37 to the vacuum plate 59 provides such a retaining force on the substrate 13 after its transfer to the substrate holder 37.

Another function of the substrate holder 37 is to preheat the substrate in preparation for subsequently bonding the device 11 to the metallized circuit leads 15 by a thermocompression bond. The substrate holder 37, therefore, includes a heater 91 which has a thermoconductive extension 92 along the central portion of the substrate holder 37 which terminates in the vacuum plate 59. The remainder of the top plate 86 of the substrate holder 37 is insulated from the heater 91 by a thermoresistive bushing 93. Material for such thermoresistive bushing is commercially available as, for instance, the type sold under the tradename of "Marinite." The thermoresistive bushing 93 reduces the amount of energy which has to be supplied to the substrate holder 37 by limiting the conduction of heat through the substrate holder 37 and into the rotating member 31.

Some of the heat nevertheless conducted into the lever 32 contributes to at least some thermoexpansion of the lever. However, since each substrate 13 after being loaded onto the substrate holder 37 is located with respect to the reference axis 39, and the position of the reference axis 39 is unaffected by any thermoexpansion of the lever 32, the accuracy of the substrate alignment remains unaffected by any thermoexpansion of the lever 32.

The heater 91 and the thermoresistive bushing 92 extend through an aperture 96 in the lever 32. The aperture 96 is sufficiently large to provide sufficient clearance for lateral movement of such portions of the substrate holder 37 which extend through the lever 32 to permit lateral movement of the substrate holder 37 within the aperture 96. Such lateral movement is taking place when the manipulator 65 reorients the substrate holder 37 to align the bond site 12 of the substrate 13 to the reference axis 39. During such alignment, neither the underside of the top plate 86 of the substrate holder 37 nor the extending portions of the substrate holder 37 are in contact with the lever 32 such that the substrate holder is completely separated from the lever.

THE DEVICE TACK BOND STATION

Figure 13:
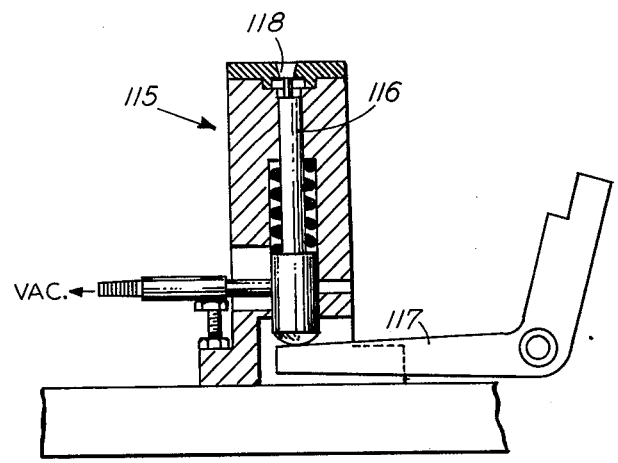
FIG. 13 is a sectional view of a device centering mechanism located on the sorting apparatus in FIG. 12.
Figure 12:
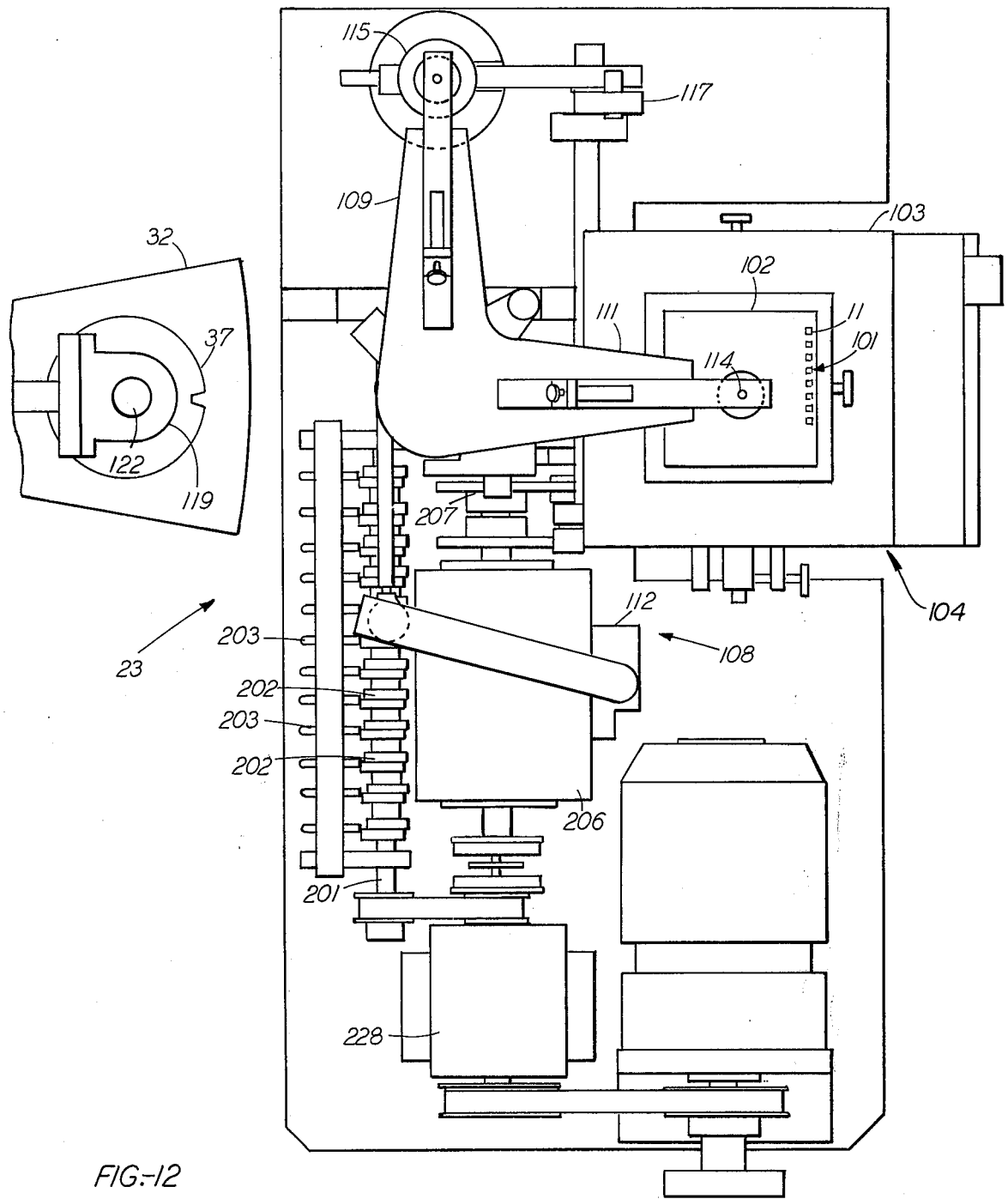
FIG. 12 is a top view of a tack bond station of the apparatus in FIG. 2, depicting in more detail a device sorting apparatus.
Figure 14:
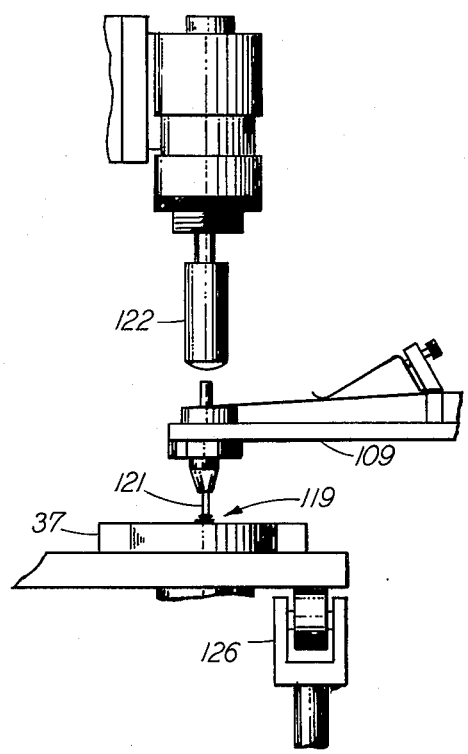
FIG. 14 is a side elevation of a tack bond mechanism of the tack bond station in FIG. 12.

After having been aligned to the reference axis 39, the substrate is moved on the substrate holder 37 from the alignment station 22 to the device tack bond station 23. Reference is made to FIGS. 12, 13 and 14 of the drawing wherein mechanisms of the tack bond station are shown in greater detail.

At the tack bond station 23, devices 11 are supplied in an array 101 on a carrier 102 shown in FIG. 12. The carrier 102 is held by a special adjusting plate 103 mounted to an otherwise standard commercially available 2 × 2 inch indexing table 104. The adjusting plate 103 is equipped with an X-Y-θ precision adjustment mechanism similar to that of the manipulator 65 which permits the array 101 to be aligned with the indexing movement of the table 104. The indexing table 104 is part of a sorting apparatus, designated generally by the numeral 108. Apparatus similar to the apparatus 108 is commercially available from Teledyne TAC under the tradename "MInisorter." The present apparatus 108 differs from the standard commercial apparatus in several respects. One of the differences is the already described adjusting plate 103.

Another modification is the addition of a second vacuum sorting arm 109. This arm 109 is mounted to a standard sorting arm 111 to be driven by a standard operating mechanism 112. In operation, the sorting arm 111 rotates through a predetermined angle in a horizontal plane and undergoes vertical movement at the beginning and end of its rotational path. At the beginning of the rotational path of the arm 111, a standard vacuum tip 114 is activated to pick up an aligned device 111 from the array 101. At the end of the rotational path of the sorting arm 111, 90° from its beginning, the device 11 is normally released to another carrier. The modified apparatus 108 substitutes for such a carrier a centering apparatus 115 similar to that described in U.S. Pat. No. 3,776,394 to Miller and assigned to the assignee of this application. Another similar apparatus is that described in an application Ser. No. 414,481 filed Nov. 9, 1973 and assigned to the assignee of this application. With the centering apparatus 115 in operation, a vertically movable post or ram 116 accepts a device 11 from the sorting arm 111. The vertical movement of the ram 116 is controlled by a special cam lever mechanism 117 driven by the standard operating mechanism 112. According to the standard mode of operation of the centering device 115, the device 11 is drawn down the sloping sides of a centering cavity 118 to be centered with respect to the ram 116. The arm 116 is then moved up again to return the centered device to be picked up by the arm 109.

After depositing the device 11 on the ram 116, the sorting arm 111 returns by rotation in the reverse direction to a position adjacent the expanded array 101 to pick up another device 11. The second vacuum sorting arm 109 is mounted at right angles to the standard arm 111 to move into alignment with the center of the centering mechanism 115 as the standard arm 111 rotates back to the position adjacent the expanded array. As the arm 111 comes to rest at a pickup position at the array 101, the arm 109 is in alignment with the centering mechanism 115. Centering of the deposited device 11 at the centering mechanism 115 takes place during the time the arm 111 returns to the array 101 to pick up another device 11. The indexing table is programmed to index and to present a new device 11 to the vacuum tip 114 of the arm 111 each time the arm 111 returns to the array 101.

Simultaneously with the pickup of one of the devices 11 from the expanded array 101 by the arm 111, the second arm 109 picks up the centered device 11 from the ram 116 at the centering mechanism.

As the arm 111 transfers another device 11 to the centering mechanism 115, the arm 109 transfers the centered device 11 from the centering mechanism 115 through a right angle rotation into alignment with the bond site 12 on the substrate 13 as it is just being moved by the rotating member 31 into a tack bond position 119.

In this position, the device pickup tip 121 of the arm 109 is axially aligned with a linear actuator 122 shown in FIG. 14. The actuator 122 follows the vertical motion of the arm 109 and applies a measured tack bond force through the pickup tip 121 just as the centered device 11 is deposited on the bond site 12 of the substrate 13. At that time, a new device is being deposited on the ram 116 by a corresponding pickup tip 114 on the arm 111.

Referring again to FIG. 14, at the tack bond station, the end of the lever 32 is being supported by a roller cam 126. The cam 126 raises the lever 32 and the substrate holder 37 thereon to a horizontal position and provides vertical rigidity against the applied force from the actuator 122. The vertical movement of the lever 32 is only slight in the order of three one-thousandths of an inch. The lever 32 undergoes such vertical movement at the alignment station as well as the tack bond and final bond positions.

Between the initial loading of the substrate 13 at the load station 21 and the movement of the loaded substrate to the tack bond station 23, the heater 91 has preheated the loaded substrate 13 to a range of approximately 265–275°C. This temperature is given as a specific example for the particular devices to be bonded. In general, the temperature to which the substrate 13 is preheated is approximately the bonding temperature desired for permanently bonding the beam leads of the device 11 to the leads 15 of the substrate. Additional bonding heat is then applied for a brief period through the bonding tip to minimize temperature degradation of the devices. However, a temporary or preliminary bond between the device 11 and the substrate 13 is advantageously and successfully made with no additional heat supplied to the tip 121.

From the tack bond station 23, the rotating member 31 moves the substrate holder past the monitoring station 24 to the final bond station 26. The monitoring station 24 utilizes a photosensitive recognition system 128 to ascertain whether or not the device 11 has, in fact, been tack bonded to the substrate 13. The recognition system 128 includes the monitoring unit 41 and a fibre optics tube 131. The monitoring unit 41 emits a beam of light through the tube 131. The tube 131 terminates adjacent the bond site 12 of the substrate 13 on the substrate holder 37 at the monitoring station 24. The bond site 12 reflects more light than the darker surface of the beam lead device 11. Consequently, a lesser amount of light is reflected back into the tube 131 when one of the devices 11 has in fact been tack-bonded to the substrate 13 than when no device 11 is present at the bond site 12. A sensor (not shown) in the monitoring unit 41 distinguishes between the light reflected from the bond site 12 and the device 11.

Logic circuitry (not shown) generates an error signal in response to the recognition of the absence of one of the devices 11 from one of the corresponding substrates 13. The error signal is applied to inhibit the operation of a bonding apparatus 134 at the final bond station 26 upon the next movement of the substrate holder 37 to the final bond station. The signal also prevents the respective substrate 13 from being unloaded into the magazine 46 at the unload station 28. The error signal can further be applied to initiate an audible or visual alarm to an operator supervising the operation of the apparatus 18. Such an alarm signal may be initiated upon one, two or more consecutive absences of devices 11 from their corresponding substrates 13 to signal faulty handling of the devices 11.

THE FINAL BOND STATION

Figure 15:
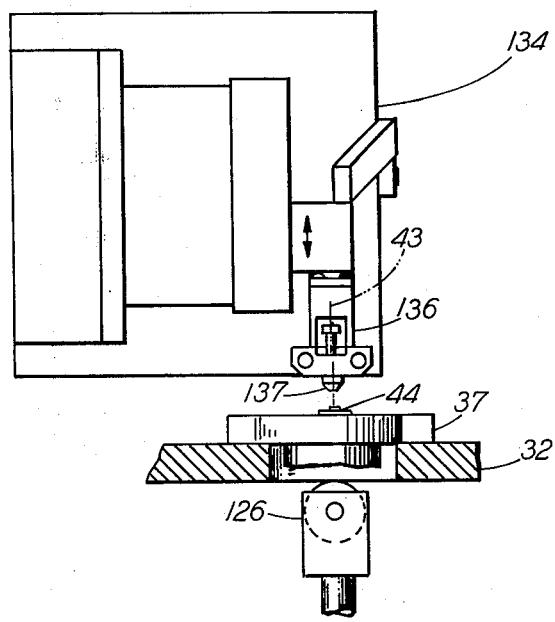
FIG. 15 is a side view of a final bond station of the apparatus in FIG. 2.

At the final bond station 26, the substrates 13 having respective devices 11 tack bonded thereto are moved with their respective substrate holders 37 into alignment with the bonding axis 43 of the bonding apparatus 134, shown in FIG. 2 and in greater detail in FIG. 15. The selection of the type of bonding apparatus 134 is not critical. Several bonders are commercially available which are capable of performing a suitable permanent thermocompression bond. The bonding apparatus 134 typically includes a bonding head 136 which is reciprocably movable along the bonding axis 43. The bonding head 136 has a tip 137 which contacts the beam leads 14 of the device 11 during bonding. The tip 137 is typically heated. The thermal energy supplied to the leads 14 and 15, from the tip 137 and from the substrate holder 37, together with the compressive energy supplied through the bonding head 136 to the tip 137 effect a permanent bond between the beam leads 14 and the metallized circuit leads 15. Bonding periods and temperatures are generally known. In each case they depend, to some extent, on the size of the desired bond, on the type of material to be bonded, on the desirable pressure to be applied by the bonder, as well as on the type of electrode used on the bonder.

POST BOND INSPECTION AND HANDLING OF THE SUBSTRATE, AND RECENTERING OF THE SUBSTRATE HOLDER

After bonding, the substrate holder 37 is indexed to the final inspection station 27, shown in FIG. 2. At the inspection station 27, the bonded product 44 is monitored by a closed circuit television camera 141 which views the product through a microscope objective mounted to the camera 141. The quality of the bonded product 44 is reviewable on a TV projector 143 which is coupled to the camera 141. An operator recognizing a faulty bond, a misaligned device 11 or any other visually discernible defect triggers the reject procedure at the unload station 28.

Figure 16:
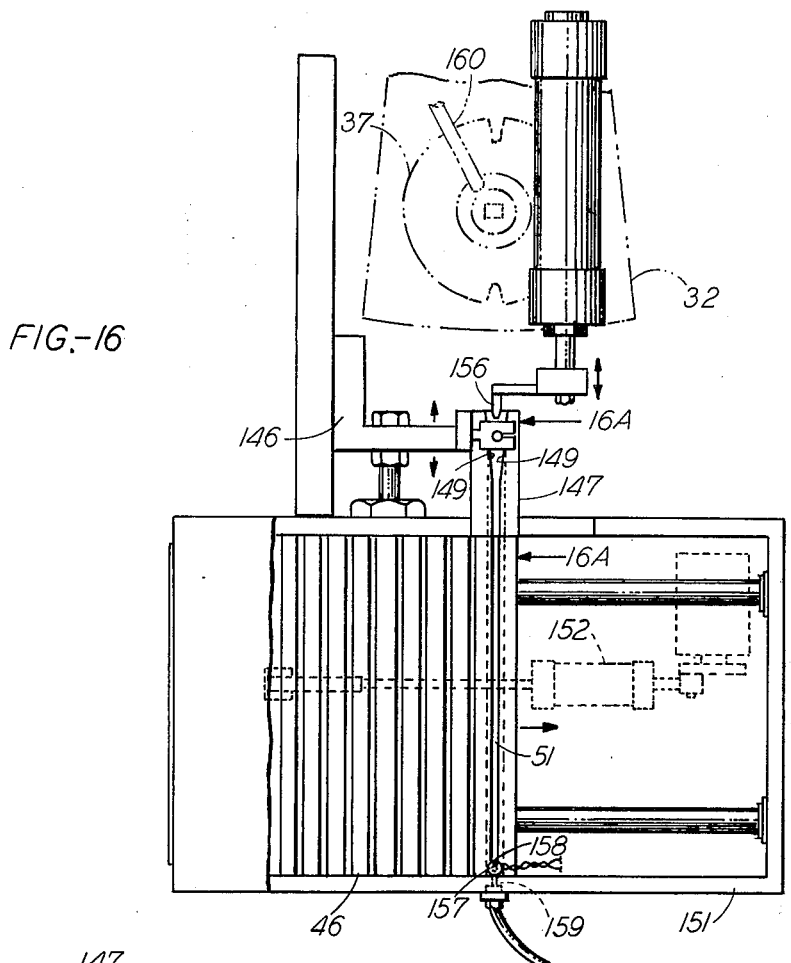
FIG. 16 shows an unload station of the apparatus in FIG. 2 in greater detail.

From the final inspection station 27, the substrate holder is indexed to the unload station 28 where the substrate 13 with the bonded device 11 is unloaded. Referring to FIG. 16, a standard vacuum unloading arm 146 reciprocatably moves between the substrate holder 37 and a substrate receiving platform 147 to unload the substrate 13 from the substrate holder, and to deposit the substrate 13 on the platform 147. The platform 147 is tiltably mounted and actuated by an air cylinder 148 to discard the substrate 13 should a signal have been initiated to indicate that the substrate is defective. In the absence of such a signal, the platform 147 remains horizontal and the unloaded substrate 13 remains positioned thereon to be loaded into one of the magazines 46. Tapered guides 149 on the platform 147 narrow into the proper track width for the substrates 13. A magazine supporting structure 151 holds a single magazine 46 in a horizontal position. A slider crank and feed pawl mechanism 152 sequentially aligns each of the tracks of the magazine 46 in extension of the guide 149.

After the substrate 13 has been deposited on the platform 147 by the vacuum arm 146 and no signal has been received to discard the substrate, an actuator ram 156 pushes the substrate 13 along the guides 149 into one of the aligned tracks of the magazine 46.

In a particular aspect of the present invention, a photosensor 157 is located at the last substrate position 158 of the respective track 51 in alignment with the platform 147. The photosensor 157 recognizes the presence of one of the substrates 13 in the last load position of the respective track 51 in alignment therewith to generate a signal for actuating the mechanism 152 to index the magazine for aligning the next adjacent track in the magazine with the platform 147. As the ram 156 pushes consecutively unloaded substrates 13 into the respective track 51, the substrates tend to collide and tend to transfer energy from substrate to substrate. At times, the substrates 13 bounce off one another to maintain gaps between some of the substrates as they are loaded into the magazine 46.

In some cases the photosensor 157 recognizes the presence of one of the substrates 13 in the last position 158 of the track 51 of the magazine 46 before the track is actually fully loaded with substrates. Consequently, the magazine 46 is indexed prior to the time that such respective track is fully loaded with substrates 13. To prevent such partial loading of the tracks of the magazine 46 an air nozzle 159 directs a stream of air along the track 51 of the magazine 46 being loaded. The stream from the nozzle 159 flows opposite the direction in which the substrates 13 are being pushed by the ram 156. The air stream consequently dampens the bouncing of the substrates 13 as they are being pushed along the track. Thus, by the time one of the substrates is pushed into alignment with the photosensor 157, the respective track 51 is filled and the magazine is ready for indexing To ascertain that the substrate 13 has, in fact, been cleared from the substrate holder 37, a stream of high pressure air from a nozzle 160 is directed against the vacuum plate 59 to push off one of the substrates 13 should it not have been unloaded by the vacuum arm 146 at the unload station. Clearing the substrate holder 37 prevents a new substrate 13 from being loaded onto one already located on the substrate holder 37 when the holder 37 is indexed around to the substrate load station 21.

Figure 17:
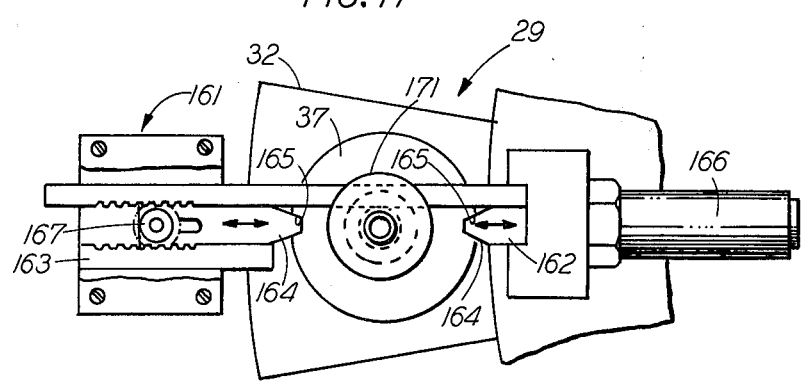
FIG. 17 is a top view of a recenter station of the apparatus in FIG. 2.

From the unload station 28, the substrate holder 37 is indexed to the recenter station 29. Referring to FIG. 17, there is shown a recenter mechanism 161 located at the recenter station 29. The mechanism 161 includes two counteracting centering wedges 162 and 163. Each of the wedged ends 164 fits into a corresponding one of two wedged recesses 165 located opposite from one another on the periphery of the substrate holder 37. When the substrate holder 37 is located at the recenter station, the linear actuator such as the air cylinder 166 forces the end 164 on the wedge 162 into the corresponding recess 165 on the substrate holder 37. A reversing gear 167 imparts the motion of the wedge 162 in the reverse direction to the wedge 163 to force the corresponding end 164 into the opposite recess 165 on the substrate holder 37.

The recenter mechanism 161 repetitively moves each of the eight substrate holders 37 to a similar starting location on the rotating member 31 as the respective levers 32 are indexed in sequence to the recenter station 29. The mechanism 161 corrects for locational variations from a center position in the X and Y as well as in the rotational directions. These corrections prevent an error in the position of the substrate holder 37 from accumulating as the substrate holder undergoes slight planar adjustment each time one of the substrates 13 is aligned to the reference axis 39 at the alignment station 22.

In addition to centering the substrate holder 37 at the recentering station 29, the temperature on the vacuum plate 59 of the substrate holder 37 is monitored. An infrared sensing device 171 is mounted above the substrate holder 37 as it is located at the recenter station 29. The sensing device is a commercially available unit sold, for instance, by Raytek, Inc. under the tradename "Thermalert." The temperature monitor by the device 171 generates a control signal which regulates the current flowing through each of the heaters 91 in the substrate holder 37. The temperature on the heaters 91 can, of course, be monitored by means other than the device 171. However, since the recenter station provides direct access to the vacuum plate 59 without a substrate covering it, and since the stationary device 171 does not require rotational movement with the member 31, the device 171 is structurally simple.

ELECTRICAL AND VACUUM SUPPLY TO THE SUBSTRATE HOLDER

Figure 18:
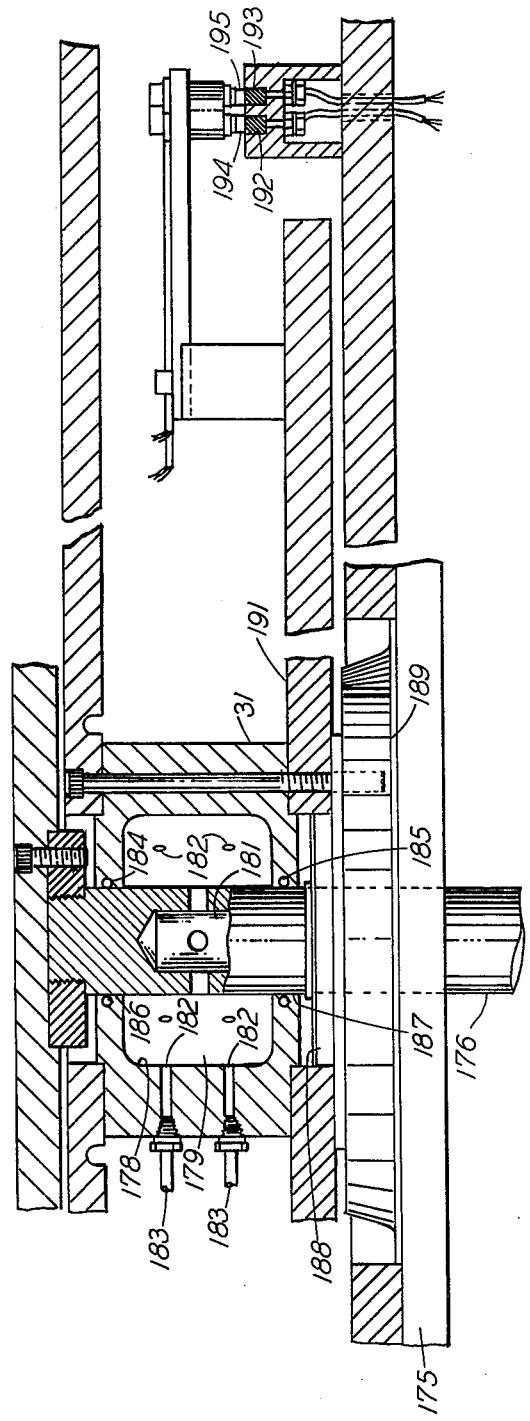
FIG. 18 is a section through a central portion of the apparatus in FIG. 2.

Connections for the electrical heaters 91 and for vacuum-air needs at each end of the levers 32 are made from a stationary base 175 to the rotating member 31. Referring to FIG. 18, a section of the rotating member 31 is shown in relation to the base 175.

A central stationary shaft 176 is mounted to the base 175 concentric with the central axis 19 of the apparatus 18. The rotating member 31 rotatably seats on the shaft 176. An annular wall 178 of the member 31 forms a chamber 179 about the shaft 176. Vacuum is connected through a central passage 181 in the shaft 176 to the chamber 179. Apertures 182 in the wall 178 connect to vacuum lines 183 which extend to the levers 32 and the respective substrate holder 37. Seals 184 and 185 at the top and bottom of the chamber 179 minimize air leakage at relatively movable junctions 186 and 187 between the shaft 176 and the rotating member 31.

An output shaft 188 of an eight portion indexing drive 189 directly coupled to a plate 191 of the member 31 rotates the member 31. The rotational movement of the member 31 requires special electrical connections to be made to supply the power to the heaters 91 on the substrate holders 37. Conductive rings 192 and 193 concentrically mounted to the base 175 provide regulated electrical power. Slidable contacts 194 and 195 mounted to the plate 191 transfer the electrical power from the rings 192 and 193 to the eight heaters 91 on the substrate holders 37. The temperature generated by each of the heaters 91 is sufficiently close to that of the others that the temperature in each of the heaters 91 is controlled jointly with the temperature of the seven other heaters.

APPARATUS INTERACTION

The described apparatus 18 operates normally on a timing cycle which requires approximately two seconds. Approximately every two seconds a substrate 13 with a device 11 bonded thereto is unloaded at the unload station 28 into one of the magazines 46.

The two second cycle time is controlled by the operating speed of the sorting apparatus 108 shown in FIG. 12. The apparatus 108 is timed by a normally continuously rotating cam shaft 201 having a battery of cams 202. The cams 202 operate switches 203 to control the function of the sorting apparatus 108 and to pace a sequence which controls the operation of the apparatus 18 in general. In addition to the cams 202 the operating mechanism 112 includes a barrel cam 206 and a lift cam 207 which controls the motion of the transfer arms 109 and 111.

Figure 19:
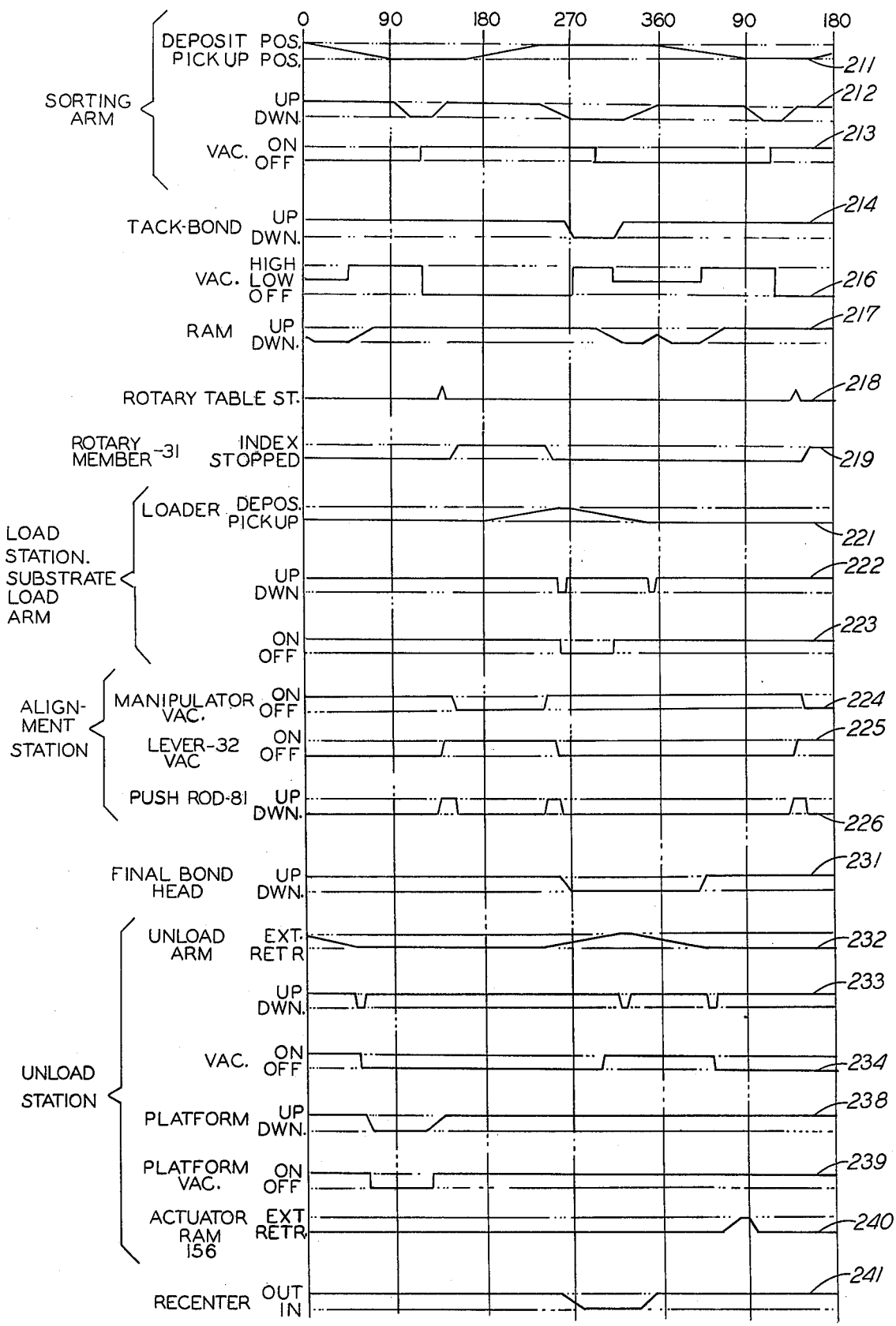
FIG. 19 is a timing chart showing how various described components of the apparatus in FIG. 2 cooperate with each other.

Referring now to FIG. 19, there is shown a schematic representation of the function of various operating elements of the apparatus 18 as they relate to each other and to the time cycle established by the sorting apparatus 108. A variable 211 represents the horizontal position of the sorting arms 109 and 111. Next thereto, variable 212. At the starting position of 0° rotation on the sorting apparatus 108, the sorting arm 109 is located in the tack bond position 119 and raised to its upper position. This places the sorting arm 111 above the centering mechanism 115. As the timing cycle moves on, the sorting arms 109 and 111 move toward the centering mechanism 115 and the carrier 102 respectively, where they move down and where a vacuum is turned on at each of their respective tips 121 and 114 to cause the tips to pick up devices. The vacuum function 213 shows the vacuum for the tips 121 and 114 for each of the arms. After the device 11 has been removed from the array 101, the indexing table 104 is advanced at approximately the 200° mark in the timing cycle to present the next device 11 from the array 101 to the pick up position.

The function 214 shows the movement of the linear actuator 122, the actuator 122 provides the necessary force for the tack bond operation when the sorting arm 109 is depositing a centered device 11 at the tack bond position 119.

The functions 216 and 217 further describe the operation of the centering mechanism 115. The centering mechanism 115 utilizes a high and a low vacuum in the ram 116 as shown by the function 216. The high vacuum state refers to a connection to a vacuum supply operating in a range of 20–26 in.Hg. which is preferred in substantially all operations of the disclosed apparatus 18. The low vacuum state is generated by connecting the ram 116 to a supply in the range of approximately 1–3 in. Hg. The low vacuum aids the device in sliding down the sloped walls of the centering cavity 118. However, the vacuum is sufficiently reduced that it does not interfere with any lateral movement of the device 11 relative to the ram 116. The reciprocating movement of the ram 116 should be noted which also aids to center the device 11 in the centering cavity 118.

The function 218 shows triggering the motion of the rotary table referred to as the rotating member 31. Triggering of the member 31 takes place at the position of 140° in the timing cycle. The motion of the member 31 is produced by a barrel cam (not shown) of the indexing drive 189. The total cycle of the indexing drive 189 is 360°. Because of the rotary speed of the drive 189, one cycle of the drive 189 equals 120° in the timing cycle. 45° at the leading and trailing end of the total motion of the drive 189 is used for activating the push rod 81. The remainder of the cycle is used to index the member 31. Indexing, consequently takes place during 90° of the timing cycle. The movement of the rotating member 31 is shown by the function 219. Some functions taking place at the stations about the rotating member 31 extend beyond the 360° cycle of the sorting apparatus 108. The graph is consequently extended over another half cycle.

Already during the initiated movement of the rotating member 31 the vacuum transport arm 58 is triggered to move from a pickup position at the platform 60 toward the substrate holder 37 when it becomes positioned at the load station 21. Functions 221, 222, 223 show the horizontal movement, vertical movement and vacuum supply of the vacuum arm 58, respectively. The vacuum arm 58 moves toward the substrate holder 37 and deposits a substrate 13 on the substrate holder 37 almost immediately upon the rotating member 31 coming to rest. At that time, the respective lever 32 has positioned the substrate holder 37 at the load station. The vacuum arm then retracts to the escapement 57 and picks up the next substrate 13 before coming to rest in the raised position at the escapement 57.

The functions 224 and 225 represent the vacuum supply cycle at the manipulator 65 and the lever 32, and the function 226 indicates when the push rod 81 raises the lever 32 to transfer the substrate holder 37 between the manipulator 65 and the lever. Immediately upon the transfer of the substrate holder 37 to the manipulator 65, the reference system 66 begins its video scan of the substrate 13 at the alignment station. The allowed time slot for recognizing the portion of the substrate 13 with respect to the ideal position stored in the memory of the reference system 66 is from the beginning of the scanning process to the 360° position of the timing cycle. If the deviation of the position from the reference axis 39 has been ascertained by the time that the 360° timing position is reached, the sorting apparatus 108 continues into its next cycle. A portion of the time during this following cycle is still allocated to apply an error signal generated by the reference system 66 to control the manipulator 65 in aligning the substrate to the desired position with respect to the reference axis 39.

If, however, the position of the substrate 13 is such that the scan of the reference system 66 cannot recognize its position in relation to the stored image position by the time the timing cycle reaches the 360° position, an extended scan time is allocated. The reference system is programmed to permit optical scanning of the substrate 13 to continue for a total of three seconds. To avoid an interference with the operations of the following cycle initiated by the apparatus 108, a clutch-brake mechanism 228 interrupts the operation of the apparatus 108 to stop the cycle time in the 360° position. The clutch-break mechanism 228 is triggered by a signal from the reference system. The apparatus 108 is reactivated with the new cycle immediately upon the reference system 66 recognizing the position of the substrate 13 in relation to the position of the stored image. Again, the beginning of the new timing cycle is used to operate the manipulator 65 to align the substrate 13 with respect to the reference axis 39.

If the true location of the substrate 13 has not been recognized after the allotted time of three seconds, the cycle is continued. However, an error signal is stored in a shift register (not shown). The error signal causes the product 44 to be discarded when it reaches the unload station 28. The additional time for a total of three seconds is preferred even though shorter or longer scanning times could be selected.

The function 231 shows the approximate bonding operation of the bonding head 136 at the final bond station 26. The exact bonding time is slightly variable and depends, in part, on bonding temperatures, the applied pressure and the type of bonding tip 137 used.

The functions 232 and 233 depict the horizontal and vertical motions of the vacuum unloading arm 146, the function 234 shows the application of vacuum to the arm 146. Similar to the arm 58 at the load station 21, the arm 146 remains stationary in its raised and retracted position above the receiving platform 147 after having deposited the last unload product 44 thereon. After being triggered during the indexing movement of the rotary member 31, the arm 146 moves to the substrate holder 37 to pick up the bonded product 44 therefrom. The vacuum to the arm 146 is activated during its movement to the substrate holder 37 and deactivated when the product 44 is transferred from the arm 146 to the platform 147.

Figure 16A:
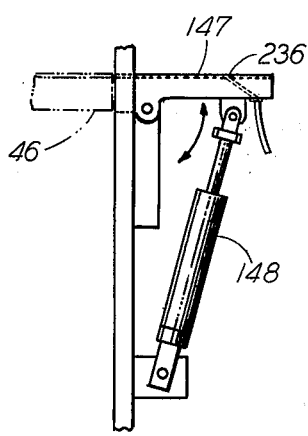
FIG. 16a shows a side view of a product reject mechanism of the unload station in FIG. 16.

The platform has a small vacuum port 236 to aid the transfer of the product 44 from the arm 146 to the platform. The vacuum suction remains normally turned on even after the deposited product 44 has been moved by the ram 156 into the magazine 46. However, the vacuum at the port 236 is turned off for a brief period when defective product has been deposited on the platform 147. To discard the defective product a linear actuator 148 shown in FIG. 16a tilts the platform downward. The function 238 shows the tilting of the platform 147. Simultaneously therewith, the vacuum is at the port 236 turned off as shown by the function 239 in FIG. 19. The defective product slides from the tilted platform 147.

The function 240 shows the motion of the ram 156. When the defective product 44 is discarded from the platform 147, movement of the ram 156 is inhibited. However, during the next cycle the platform 147 is shown as not tilting. Instead, the ram 156 pushes the product 44 into the magazine 46. The vacuum at the port 236 is not shut off after the product 44 has been loaded into the magazine 46.

The centering wedges 162 and 163 are activated after the rotating member 31 has indexed the next substrate holder 37 to the recenter station 29. Timing the recenter mechanism 161 to move the wedges 162 and 163 into contact with the substrate holder 37 is not critical but takes place shortly after the rotating member 31 has come to rest as shown by the function 241. The vacuum between the substrate holder 37 and the lever 32 is not turned off during the recenter operation. However, briefly switching the vacuum off during the recenter operation is a workable alternate mode of operation.

The invention herein has been described in terms of a specific embodiment to process such specific articles as, for instance, beam-lead devices. The invention, however, is not limited by the illustrative description. Variations and modification can be made without departing from the spirit and scope of the invention. In one respect, the invention is seen to apply to sequential handling and bonding of beamless devices to substrates.

What is claimed is:

1. In a method of bonding an article to a substrate, the steps comprising:
   locating the substrate on a substrate holder mounted on a support member;
   transferring the substrate holder from the support member to a manipulator;
   manipulating the position of the substrate holder with respect to the support member to align the substrate to a reference axis; and
   transferring the substrate holder from the manipulator to the support member to retain the position of the substrate aligned to the reference axis with respect to the support member.

2. A method of bonding an article to a substrate, which comprises:

moving a substrate holder mounted on a support member in sequence to a substrate alignment station and to a bonding station;

transferring the substrate holder at the alignment station from the support member to a manipulator;

manipulating the position of the substrate holder to align a substrate located thereon with respect to a reference axis; and transferring the substrate holder from the manipulator to the support member to retain the position of the substrate aligned to the reference axis with respect to the support member, whereby a bond site on the substrate is precisely aligned with the article to be bonded thereto when the substrate holder is moved to the bonding station.

3. A method according to claim 2, wherein transferring the substrate holder from the support member to the manipulator comprises:

moving the support member toward the manipulator in a direction perpendicular to the plane of manipulation to bring the substrate holder into contact with a surface on the manipulator;

attaching the substrate holder to the surface on the manipulator and releasing the substrate holder from the support member; and separating the support member from the substrate holder; and wherein transferring the substrate holder from the manipulator to the support comprises moving the support member toward and into contact with the substrate holder, attaching the support member to the substrate holder and releasing the substrate holder from the receiving surface of the manipulator; and separating the support member and the substrate holder from the manipulator.

4. A method of bonding an electronic device to a substrate, which comprises:

loading the substrate onto a substrate holder at a loading station;

moving the substrate holder along a predetermined path from the loading station to an alignment station, to a bonding station and then to an unloading station;

adjusting the position of the substrate holder with respect to the path when the substrate holder is located at the alignment station to move a bond site on the substrate into alignment with a bonding axis upon the substrate holder having moved to the bonding station;

preheating the substrate to a temperature approaching the temperature desired for bonding the device to the substrate;

aligning the device to the bond site of the substrate;

forcing the aligned device without additional heating to the bond site to tack-bond the device to the substrate; and then bonding the tack-bonded device with a heated bonding tip to the bond site whereby a permanent bond between the device and the substrate is made.

5. A method according to claim 4, wherein moving the substrate holder along the path to the bonding station comprises at least two discrete steps including indexing the holder to an article loading station and indexing the holder to a final bond station; and wherein the aligned device is tack-bonded to the bond site at the article loading station, and the permanent bond between the device and the substrate is made at the final bond station.

6. A method according to claim 4, wherein moving the substrate holder along the path comprises indexing the substrate holder along a predetermined rotary path, the method further including indexing the substrate holder along the rotary path from the bonding station to a recenter station to return the substrate holder to the position with respect to the path that is occupied prior to being adjusted with respect thereto.

7. Apparatus for bonding an article to a substrate, which comprises:

a support member movably mounted to advance along a predetermined path intersecting a bonding axis;

a substrate holder releasably mounted to the support member;

a planar manipulator, located along the path, the manipulator comprising means for releasably supporting the substrate holder, and for adjusting the position of the substrate holder with respect to the path to position a bond site in alignment with the portion of the support member intersecting the bonding axis;

means for transferring the substrate holder from the support member to the manipulator to enable the manipulator to adjust the position of the substrate holder with respect to the support member and for transferring the substrate holder back to the support member to fix and retain the adjusted position of the holder with respect to the support member; and means for aligning and for bonding the article to the bond site of the substrate at the bonding axis.

8. Apparatus according to claim 7, wherein:

the support member is a lever, the substrate holder being mounted at one end thereof;

the means for releasably supporting the substrate holder on the manipulator being adjacent to but spaced from the substrate holder in its path to and away from the manipulator; and the substrate holder transferring means comprises means for flexing the lever from its normal position toward the manipulator to move the substrate holder into contact with the planar manipulator while transferring the substrate holder from the lever to the manipulator and to move the end of the lever normally supporting the substrate holder into contact with the substrate holder while transferring the substrate holder back to the lever.

9. Apparatus according to claim 8, wherein the lever has a portion of reduced thickness to permit the flexture of the lever during the transfer of the substrate holder to occur at such portion.

10. Apparatus according to claim 7, which comprises:

an article aligning and tack-bonding station located along the path of the support member and a final bond station having a reciprocatable bonding head located at the bonding axis.

11. Apparatus according to claim 10, wherein the aligning and tack-bonding station comprises:

means for aligning the article with and transferring the article to the bond site of the substrate; and means for preliminarily attaching the article to the substrate.

12. Apparatus for bonding an article to a substrate, which comprises:
- a base;
- a support member movably mounted to advance in sequence between a substrate load station, an alignment station, a tack-bond station and a final bond station along a predetermined path with respect to the base;
- at least one substrate holder releasably mounted to the support member;
- means, located at the alignment station, for adjusting the location of the substrate holder with respect to the support member to position a substrate loaded onto the substrate holder at the substrate load station into a predetermined reference location with respect to the path;
- means, located at the tack-bond station, for preliminarily attaching the article to the substrate; and
- means, located at the final bond station for bonding the article to the substrate.

13. Apparatus according to claim 12, wherein the means for preliminarily attaching the article to the substrate comprises:
- means for centering the article on a predetermined axis;
- first means for transferring the article from a storage location to the centering means;
- second means for transferring the article from the centering means to the substrate on the substrate holder; and
- means for exerting a force through the second transfer means to the article to urge portions of the article into bonding contact with the substrate.

14. Apparatus according to claim 12, wherein the substrate holder location adjusting means comprises:
- a manipulator having a table mounted for movement in a plane parallel to the path of the support member;
- means for moving the support member toward the table;
- means for transferring the substrate holder from the support member to the table upon the moving means having moved the support member with the substrate holder toward the table, and for transferring the substrate holder back to the support member upon the moving means having moved the support member toward the table while the substrate holder is at the table; and
- means for recognizing the position of the substrate on the substrate holder with respect to the reference location, and for controlling the movement of the table to move the substrate holder until the position of the substrate corresponds substantially to the reference location.

15. Apparatus according to claim 12, wherein the support member is mounted to advance from the final bond station past a monitoring station to an unload station and then to a recenter station along a predetermined extension of the path, the unload station comprising:
- a platform, pivotally mounted;
- means for transferring the substrate and the article bonded thereto from the substrate holder to the platform;
- means for moving the substrate from the platform into a magazine; and
- means for selectively pivoting the platform, whereby, upon actuation of the pivoting means, the substrate is discarded from the platform and the substrate moving means is deactivated.

16. In an apparatus for bonding an article to a substrate, wherein the substrate is advanced by a support member from a load station along a path past an article-to-substrate bond station to an unload station, the unload station comprising:
- means for supporting a magazine, the magazine having at least one track for accepting a plurality of substrates therein;
- means for moving the substrates in sequence into a first end of the track of the magazine;
- means for indicating the presence of one of the substrates at a second end of the track; and
- means for urging the substrates away from the second end of the track, the urging means being overcome by the action of the substrate moving means, whereby a substrate is moved to the second end upon the track being substantially occupied by the substrates.

17. Apparatus according to claim 16 wherein the support member is rotatably mounted and the path is a rotational path, the support member comprising a plurality of levers, each lever being mounted at one end thereof to a central portion of the member, each lever separately supporting one holder for the substrate on the other end thereof, each of the levers being spaced from the others about the path to move into simultaneous alignment with a respective one of the stations.

18. Apparatus according to claim 17, comprising:
- a platform located at the load station;
- means for advancing a plurality of the substrates in sequence toward the platform;
- means for stopping the advance of the substrates upon one of the substrates having been positioned on the platform;
- means for separating the substrate located on the platform from the other substrates; and
- means reciprocably movable between the platform and one of the substrate holders at the load station for transferring the substrate from the platform to the respective substrate holder.

* * * * *

UNITED STATES PATENT OFFICE
CERTIFICATE OF CORRECTION

Patent No. 3,946,931　　　　　　　Dated March 30, 1976

Inventor(s) Norman Bahnck, Raymond H. Booth, John A. Boyer and Jack J. Monahan

It is certified that error appears in the above-identified patent and that said Letters Patent are hereby corrected as shown below:

Column 1, line 11, "devie" should be --devices--.
Column 7, line 18, "thee" should be --the--;
　　　　　line 21, after "screws" insert --70--.
Column 9, line 38, "36" should be --37--.
Column 10, line 57, after "substrate" (first occurrence) insert --13--.
Column 11, line 6, "MInisorter" should be --Minisorter--;
　　　　　line 37, "arm" should be --ram--.
Claim 6, line 11 "is" should be --it--.

Signed and Sealed this

Thirteenth Day of July 1976

[SEAL]

Attest:

RUTH C. MASON
Attesting Officer

C. MARSHALL DANN
Commissioner of Patents and Trademarks